US012648100B2

(12) United States Patent
Lee et al.

(10) Patent No.: US 12,648,100 B2
(45) Date of Patent: Jun. 2, 2026

(54) COVER WINDOW AND METHOD OF MANUFACTURING THE SAME

(71) Applicant: Samsung Display Co., Ltd., Yongin-Si (KR)

(72) Inventors: Dong-Sung Lee, Hwaseong-si (KR); Yongkyu Kang, Hwaseong-si (KR); Jihyun Ko, Suwon-si (KR); Hyunseung Seo, Gwacheon-si (KR); Hui yeon Shon, Seongnam-si (KR); Hyunkyung Yun, Namyangju-si (KR); Changmoo Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/142,629

(22) Filed: Jan. 6, 2021

(65) Prior Publication Data

US 2021/0289648 A1 Sep. 16, 2021

(30) Foreign Application Priority Data

Mar. 12, 2020 (KR) ........................ 10-2020-0030712

(51) Int. Cl.
H05K 5/03 (2006.01)
G02B 1/14 (2015.01)

(52) U.S. Cl.
CPC H05K 5/03 (2013.01); G02B 1/14 (2015.01)

(58) Field of Classification Search
CPC ........ G02B 1/14; G02F 1/133308; H05K 5/03
See application file for complete search history.

(56) References Cited

U.S. PATENT DOCUMENTS

| | | | |
|---|---|---|---|
| 9,048,443 B2 | 6/2015 | Namkung et al. | |
| 9,643,389 B2 | 5/2017 | Roh et al. | |
| 10,854,840 B2 | 12/2020 | Kim et al. | |
| 11,500,422 B2 | 11/2022 | Heo et al. | |
| 2011/0026122 A1* | 2/2011 | Tanaka | G02B 1/111 |
| | | | 359/586 |
| 2011/0222218 A1* | 9/2011 | Kim | H04N 5/65 |
| | | | 361/679.01 |
| 2018/0001347 A1* | 1/2018 | Cho | G02F 1/133308 |
| 2019/0033494 A1 | 1/2019 | Kim et al. | |
| 2020/0331799 A1 | 10/2020 | Seo et al. | |
| 2022/0190277 A1 | 6/2022 | Chen | |

FOREIGN PATENT DOCUMENTS

| | | |
|---|---|---|
| CN | 107346638 A | 11/2017 |
| CN | 110599901 A | 12/2019 |
| CN | 110634399 A | 12/2019 |
| JP | 6589567 B2 | 10/2019 |
| KR | 1020120006399 A | 1/2012 |

(Continued)

*Primary Examiner* — Maria V Ewald
*Assistant Examiner* — Ethan Weydemeyer
(74) *Attorney, Agent, or Firm* — CANTOR COLBURN LLP

(57) ABSTRACT

A cover window includes a base member which includes a top surface, a bottom surface opposite to the top surface, and a side surface connecting the top surface and the bottom surface to each other, a first hard coating layer on the top surface of the base member, and a protection layer in direct contact with at least a portion of the side surface of the base member.

9 Claims, 11 Drawing Sheets

(56)        References Cited

FOREIGN PATENT DOCUMENTS

| KR | 1020150000361 | A | 1/2015 |
| KR | 1020150007632 | A | 1/2015 |
| KR | 1020150025355 | A | 3/2015 |
| KR | 1020180002932 | A | 1/2018 |
| KR | 1020180031897 | A | 3/2018 |
| KR | 1020190005795 | A | 1/2019 |
| KR | 1020190012847 | A | 2/2019 |
| KR | 1020190141069 | A | 12/2019 |
| KR | 1020200123885 | A | 11/2020 |

* cited by examiner

COVER WINDOW AND METHOD OF MANUFACTURING THE SAME

This application claims priority to Korean Patent Application No. 10-2020-0030712 filed on Mar. 12, 2020, and all the benefits accruing therefrom under 35 U.S.C. § 119, the content of which in its entirety is herein incorporated by reference.

BACKGROUND

The present invention relates to a window and a method of manufacturing the same, and more particularly, to a window having improved reliability and a method of manufacturing the same.

A mobile product or a large-sized product such as a television includes a display panel in which pixels are arranged to display images and a cover window for protecting the display panel. The display panel may include a liquid crystal display panel or an organic light emitting display panel. The cover window is used to allow users to view images displayed on the display panel.

SUMMARY

To increase durability and anti-fingerprint properties, various layers may be printed or coated on the cover window. When the cover window is subject to a printing or coating process, a uniform layer may be formed on top and bottom surfaces of the cover window.

Some embodiments of the present invention provide a cover window and a method of manufacturing the same, which method is capable of forming a uniform layer on the cover window during printing or coating processes.

According to some embodiments of the present invention, a cover window includes: a base member which includes a top surface, a bottom surface opposite to the top surface, and a side surface connecting the top surface and the bottom surface to each other; a first hard coating layer on the top surface of the base member; and a protection layer in direct contact with at least a portion of the side surface of the base member.

In some embodiments, the protection layer may cover the first hard coating layer.

In some embodiments, the protection layer may expose the first hard coating layer.

In some embodiments, the cover window may further include an anti-fingerprint layer which covers the protection layer and overlaps the top surface in a plan view.

In some embodiments, the cover window may further include a second hard coating layer on the bottom surface.

In some embodiments, the cover window may further include: a transmission area; a bezel area of which optical transmittance is less than an optical transmittance of the transmission area; and a light-shield pattern on the bottom surface. The light-shield pattern may define a boundary between the transmission area and the bezel area.

In some embodiments, the side surface may include a first part which extends from the bottom surface and a second part which extends from the top surface. The first part may be perpendicular to the bottom surface. The second part may be a curved surface.

In some embodiments, the side surface may be curved.

In some embodiments, the protection layer may include polysilazane.

In some embodiments, the protection layer may include at least one selected from silicon nitride (SiNx), silicon oxide (SiOx), and silicon oxynitride (SiOxNy).

According to some embodiments of the present invention, a method of manufacturing a cover window includes: providing a preliminary base member which includes a top surface and a bottom surface opposite to the top surface; forming a first hard coating layer which covers the top surface; removing a portion of the preliminary base member along a thickness direction of the preliminary base member to form a base member which includes a first part extending from the bottom surface and a second part extending from the top surface; and forming a protection layer which covers the second part. The second part may be inclined from the first part toward the top surface.

In some embodiments, the method may further include forming an anti-fingerprint layer which covers the protection layer.

In some embodiments, the method may further include forming a second hard coating layer which covers the bottom surface.

In some embodiments, the method may further include forming a light-shield pattern which overlaps an edge of the preliminary base member and defines a boundary between a transmission area and a bezel area of which optical transmittance is less than an optical transmittance of the transmission area.

In some embodiments, after removing the portion of the preliminary base member, the method may further include attaching a release layer which covers the first hard coating layer.

In some embodiments, after forming the protection layer, the method may further include removing the release layer.

In some embodiments, the protection layer may expose the first hard coating layer.

In some embodiments, the protection layer may cover the first hard coating layer.

In some embodiments, the protection layer may include polysilazane.

In some embodiments, the protection layer may include at least one selected from silicon nitride (SiNx), silicon oxide (SiOx), and silicon oxynitride (SiOxNy).

DETAILED DESCRIPTION

Figure 1:
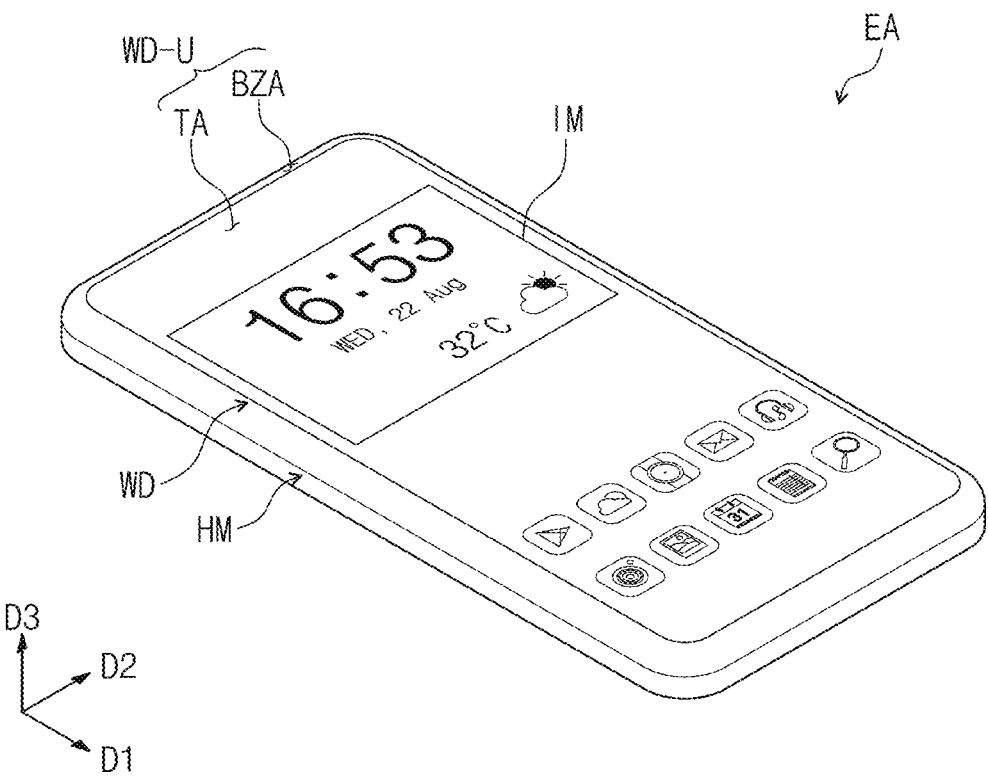
FIG. 1 illustrates an assembled perspective view showing an electronic apparatus according to some embodiments of the present invention.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the present invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof. The following will now describe some embodiments of the present invention in conjunction with the accompanying drawings.

Figure 2:
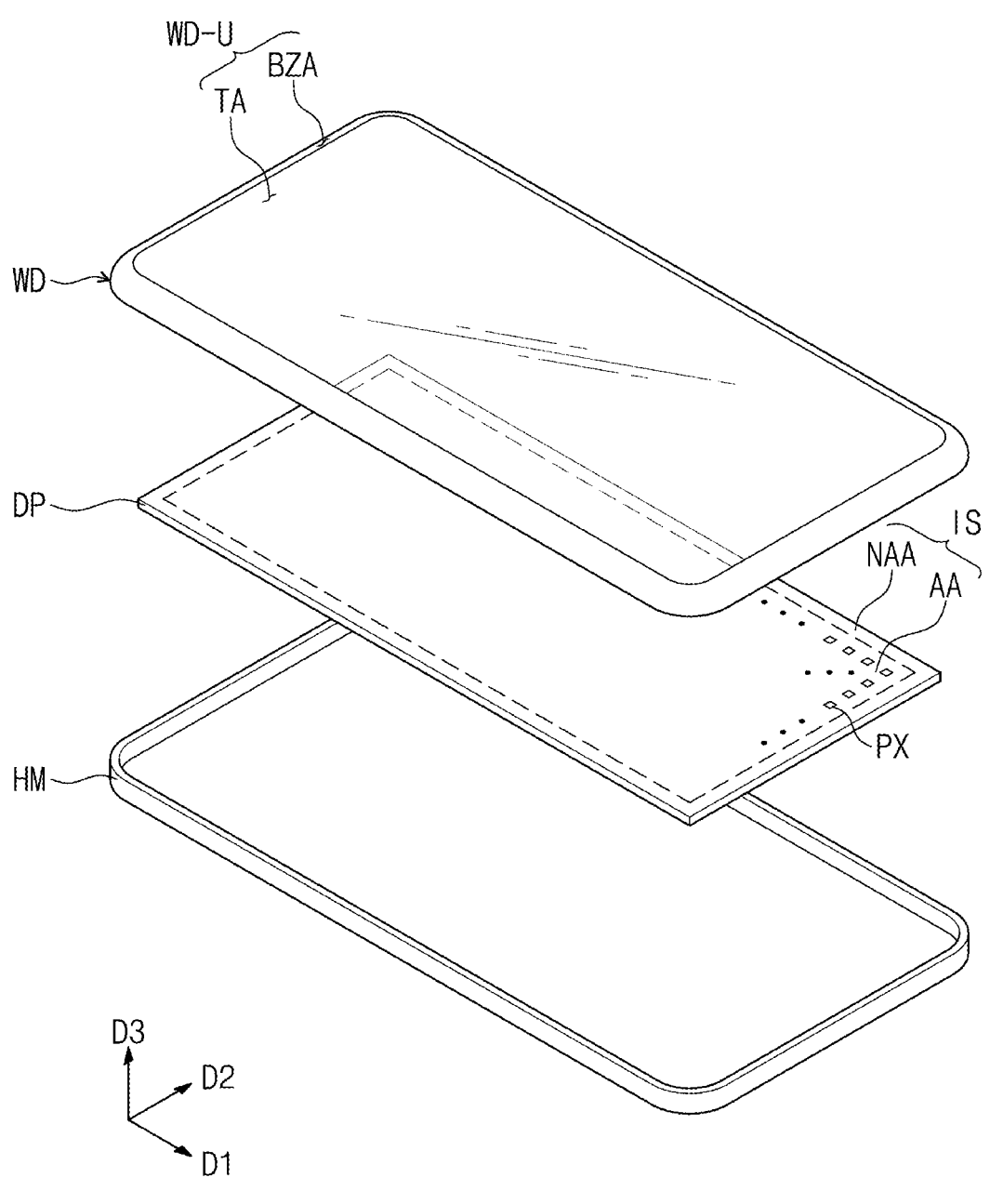
FIG. 2 illustrates an exploded perspective view showing an electronic apparatus according to some embodiments of the present invention.
Figure 3:
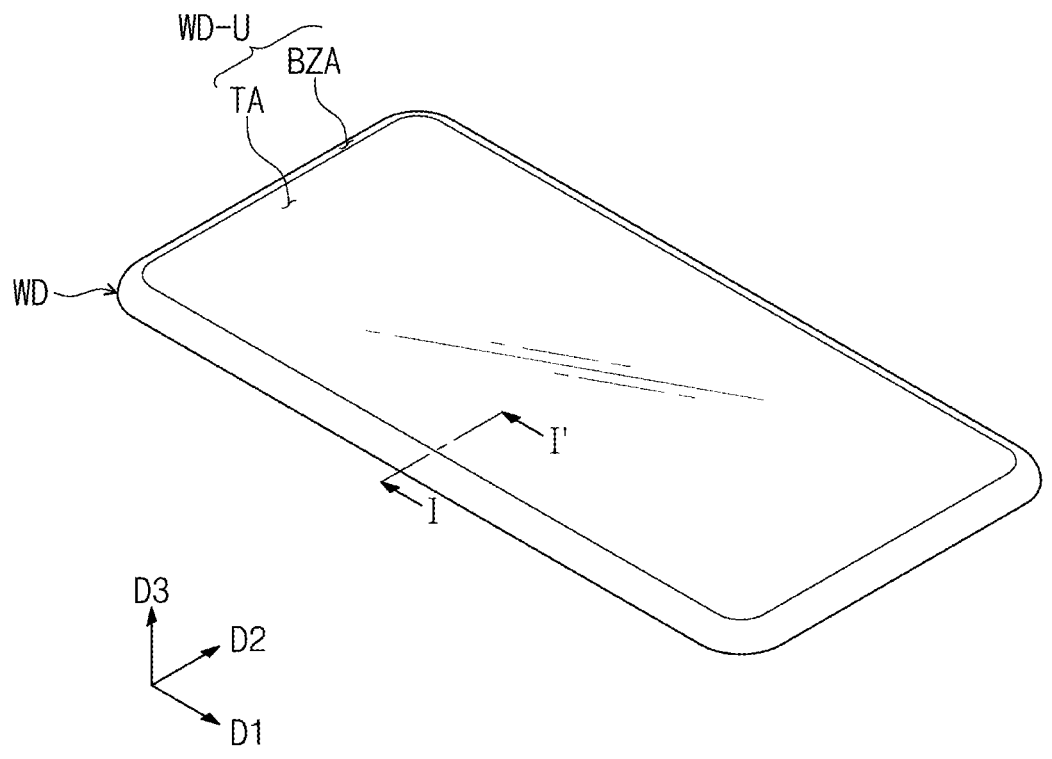
FIG. 3 illustrates a perspective view showing a cover window according to some embodiments of the present invention.
Figure 4:
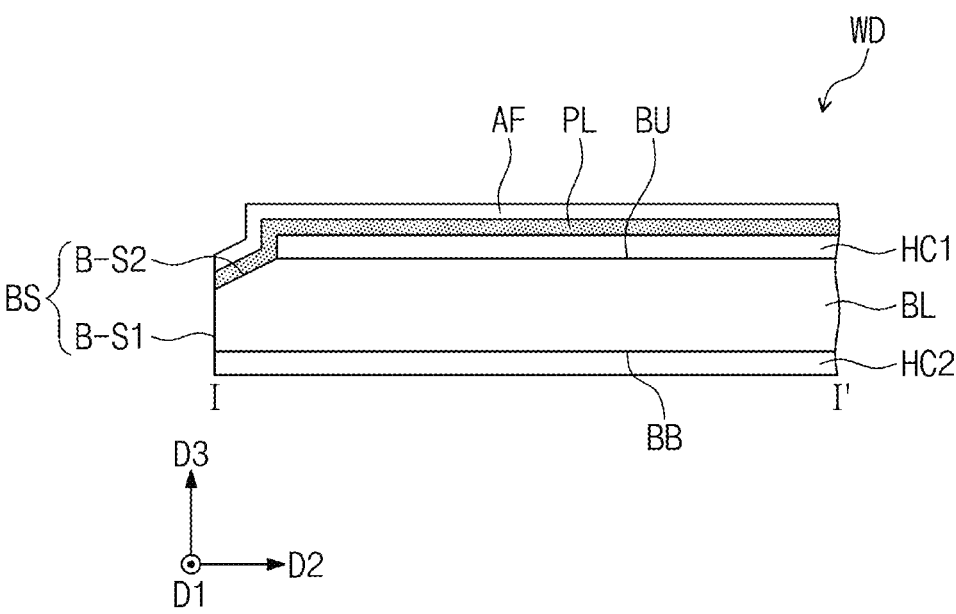
FIG. 4 illustrates a cross-sectional view taken along line I-I' of FIG. 3.

FIG. 1 illustrates an assembled perspective view showing an electronic apparatus according to some embodiments of the present invention. FIG. 2 illustrates an exploded perspective view showing an electronic apparatus according to some embodiments of the present invention. FIG. 3 illustrates a perspective view showing a cover window according to some embodiments of the present invention. FIG. 4 illustrates a cross-sectional view taken along line I-I' of FIG. 3.

FIG. 1 shows a perspective view of a flexible display device according to some embodiments of the present invention. In some embodiments, a foldable display device is illustrated as an example of the flexible display device (referred to hereinafter as a display device). The present invention, however, is limited thereto, and the display device according to the present invention may also be applicable to a curved display device, a bendable display device, a rollable display device, a stretchable display device, or any other various devices. Although not shown, the display device according to the present invention may be used not only for large-sized electronic devices such as televisions or outdoor billboards, but for small and medium-sized electronic devices such as mobile phones, personal computers, laptop computers, personal digital terminals, or automotive navigation systems.

Referring to FIGS. 1 and 2, an electronic apparatus EA displays an image IM in a third direction D3 on a plane defined by first and second directions D1 and D2. The electronic apparatus EA includes a cover window WD, a display panel DP, and a housing member HM.

The electronic apparatus EA according to the present invention may be applicable to a curved electronic device, a bendable electronic device, a rollable electronic device, a stretchable electronic device, or any other various electronic devices. Although not shown, the electronic apparatus EA according to the present invention may be used not only for large-sized electronic devices such as televisions or outdoor billboards, but for small and medium-sized electronic devices such as mobile phones, personal computers, laptop computers, personal digital terminals, or automotive navigation systems.

The cover window WD may be optically transparent. For example, the cover window WD may include glass or plastic. The cover window WD may have a single-layered or multi-layered structure. For example, the cover window WD may have either a stacked structure in which a plurality of plastic films is coupled through an adhesive or a stacked structure in which a glass substrate and a plastic film are coupled through an adhesive.

The cover window WD includes a front surface WD-U externally exposed. The image IM displayed on the display panel DP is externally visible through the front surface WD-U. When viewed in a plan view (i.e., view in the third direction DR3), the front surface WD-U of the cover window WD may be divided into a transmission area TA and a bezel area BZA.

The transmission area TA may be a region allowing incident light to pass therethrough. The transmission area TA may have a shape that corresponds to the shape of an active area AA. For example, the transmission area TA overlaps the entirety or a part of the active area AA in the third direction DR3 (i.e., thickness direction of the display panel DP). The image IM displayed on the active area AA of the display panel DP may be externally visible through the transmission area TA.

The bezel area BZA may be a region whose optical transmittance is relatively less than the optical transmittance of the transmission area TA. The bezel area BZA defines the shape of the transmission area TA. The bezel area BZA may be adjacent to and may surround the transmission area TA.

The bezel area BZA may have a certain color caused by a light-shield pattern BW which will be discussed below (See FIG. 9D). The bezel area BZA may cover a peripheral area NAA of the display panel DP and may prevent the peripheral area NAA from being externally visible. This, however, is exemplarily illustrated, and the bezel area BZA may be omitted from the cover window WD according to some embodiments of the present invention.

The display panel DP displays the image IM on a front surface IS. The front surface IS may be divided into the active area AA and the peripheral area NAA. The image IM is displayed on the active area AA. The peripheral area NAA is adjacent to the active area AA.

The display panel DP may include a plurality of pixels PX. The pixels PX emit light in response to electrical signals. The light emitted from the pixels PX forms the image IM.

Although not shown, the electronic apparatus EA according to some embodiments may further include an electronic module. The electronic module includes various functional modules for driving the electronic apparatus EA. The electronic module may be electrically connected to the display panel DP through a connector or the like. For example, the electronic module may be a camera, a speaker, or an optical or thermal sensor.

The housing member HM is disposed below the display panel DP. The housing member HM and the cover window WD are combined with each other to form an appearance of the electronic apparatus EA. The housing member HM may include a material whose rigidity is relatively high. For example, the housing member HM may include a plurality of plates or frames consisting of one or more of glass, plastic, and metal. The housing member HM provides an accommodation space inside the housing member HM. The display panel DP and the electronic module (not shown) are disposed in the accommodation space and protected from external impact.

Referring to FIGS. 3 and 4, in some embodiments, the cover window WD may include a base member BL, a first hard coating layer HC1, a second hard coating layer HC2, a protection layer PL, and an anti-fingerprint layer AF.

The base member BL has a top surface BU, a bottom surface BB, and a side surface BS. The top surface BU and the bottom surface BB may be opposite to each other. The side surface BS connects the top surface BU and the bottom surface BB to each other.

The side surface BS includes a first part B-S1 and a second part B-S2. The first part B-S1 may extend along the third direction D3 from the bottom surface BB. The second part B-S2 may extend from the top surface BU to have connection with the first part B-S1.

In some embodiments, the second part B-S2 may incline from the first part B-S1 toward the top surface BU. When viewed in cross-section, the second part B-S2 may be inclined in a diagonal direction between the third direction D3 and the second direction D2 as shown in FIG. 4.

The base member BL may include glass or may be provided as a plastic substrate. When the base member BL is a plastic substrate, the base member BL may include a polymeric material. For example, the base member BL may include polyimide, polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene, ethylene vinyl alcohol copolymer, or a combination thereof. The material of the base member BL according to the present invention, however, is not necessarily limited to the polymers mentioned above, and the base member BL may include any other materials that are optically transparent to provide users with images displayed on a display panel of an electronic apparatus.

The first hard coating layer HC1 may be disposed on the top surface BU of the base member BL. The first hard coating layer HC1 may be spaced apart from the second part B-S2. The second hard coating layer HC2 may be disposed on the bottom surface BB of the base member BL. As the hard coating layers HC1 and HC2 cover the base member BL, the cover window WD may increase in rigidity.

The hard coating layers HC1 and HC2 may include a composition for hard coating. For example, the composition may include a polymer originating from a mixture including inorganic particles that are surface-treated with silsesquioxane, siloxane compound, and silane. In some embodiments, the composition for hard coating may include a polymer unit that is obtained from the reaction of the inorganic particles surface-treated with silsesquioxane, siloxane compound, and silane.

The protection layer PL may protect a portion (e.g., second part B-S2) of the base member BL, on which portion the first hard coating layer HC1 is not formed during a process where a part of the base member BL is removed to form the inclined side surface BS. The protection layer PL may be in contact with, for example, the second part B-S2 of the side surface BS. In some embodiments, the protection layer PL may cover an entire surface of the first hard coating layer HC1 and may contact the second part B-S2. The protection layer PL may include one of an organic material and an inorganic material. For example, the organic material may include polysilazane. The inorganic material may include at least one selected from silicon nitride ($SiN_x$), silicon oxide ($SiO_x$), and silicon oxynitride ($SiO_xN_y$).

According to the present invention, since the protection layer PL which protects a portion of the base member BL, on which portion the first hard coating layer HC1 is not formed, is included during the process where a part of the base member BL is removed to form the inclined side surface BS, the base member BL may increase in durability and surface quality. Accordingly, it may be possible to provide the cover window WD with improved reliability.

The anti-fingerprint layer AF may be disposed on the protection layer PL. The anti-fingerprint layer AF may protect the protection layer PL against user's inputs or foreign substances. Among components disposed on the base member BL, the anti-fingerprint layer AF may be located at a top position and thus may be externally exposed.

Although not shown, the cover window WD may further include an anti-reflection layer disposed on the protection layer PL, but the present invention is not limited to a particular embodiment.

Figure 5:
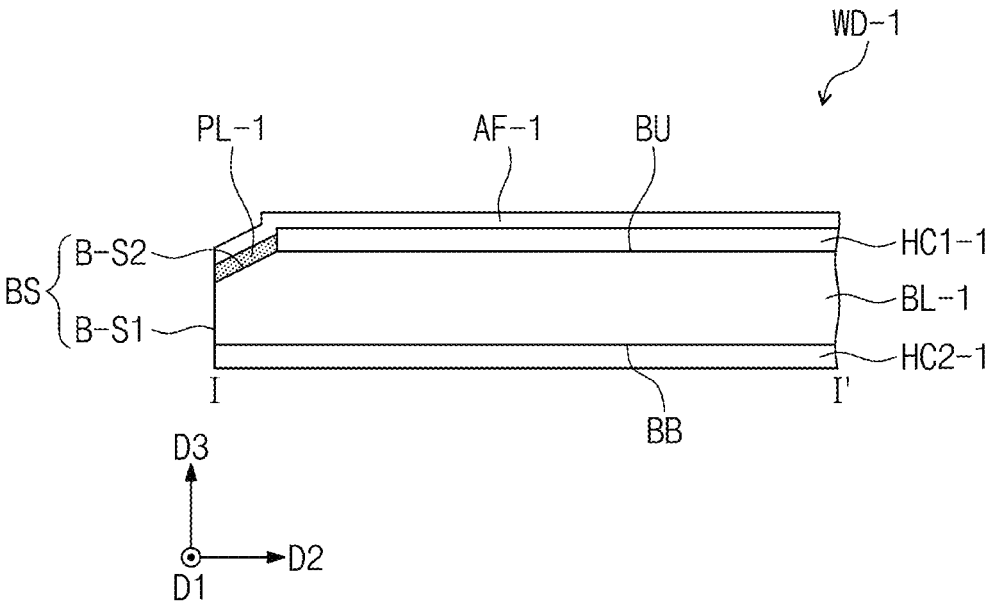
FIG. 5 illustrates a cross-sectional view showing a cover window according to some embodiments of the present invention.
Figure 6:
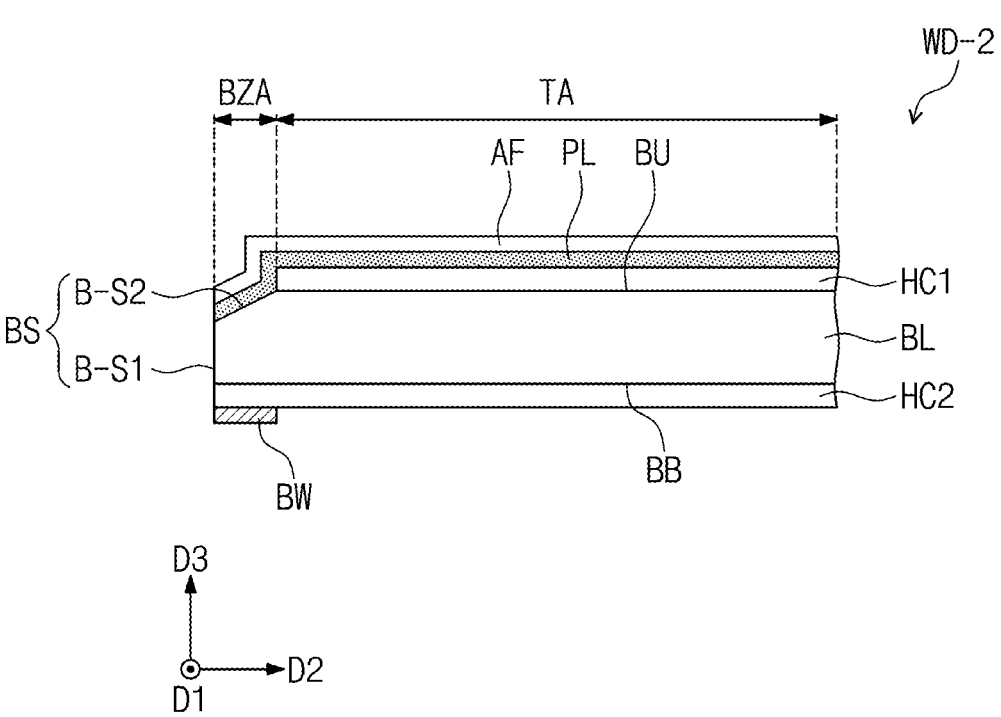
FIG. 6 illustrates a cross-sectional view showing a cover window according to some embodiments of the present invention.

FIG. 5 illustrates a cross-sectional view showing a cover window according to some embodiments of the present invention. FIG. 6 illustrates a cross-sectional view showing a cover window according to some embodiments of the present invention. In the embodiments that follow, components identical or similar to those discusses above with reference FIGS. 1 to 4 are allocated the same reference symbols, and a repetitive description will be omitted.

Referring to FIG. 5, a cover window WD-1 may include a base member BL-1, a first hard coating layer HC1-1, a second hard coating layer HC2-1, a protection layer PL-1, and an anti-fingerprint layer AF-1.

The base member BL-1 has a top surface BU, a bottom surface BB, and a side surface BS. The top surface BU and the bottom surface BB may be opposite to each other. The side surface BS connects the top surface BU and the bottom surface BB to each other. The side surface BS includes a first part B-S1 and a second part B-S2.

In some embodiments, the second part B-S2 may incline from the first part B-S1 toward the top surface BU. The second part B-S2 may be inclined in a diagonal direction between the third direction D3 and the second direction D2.

The first hard coating layer HC1-1 may be disposed on the top surface BU of the base member BL-1. The second hard coating layer HC2-1 may be disposed on the bottom surface BB of the base member BL-1.

In some embodiments, the protection layer PL-1 may be in contact with only the second part B-S2 among the surfaces of the base member BL-1. Therefore, the first hard coating layer HC1-1 may be partially exposed from the protection layer PL-1. Accordingly, the anti-fingerprint layer AF-1 may be in direct contact with both the protection layer PL-1 and the first hard coating layer HC1-1.

Referring to FIG. 6, a cover window WD-2 may include a base member BL, a first hard coating layer HC1, a second hard coating layer HC2, a protection layer PL, an anti-fingerprint layer AF, and a light-shield pattern BW.

The cover window WD-2 shown in FIG. 6 may include the same components as those of the cover window WD shown in FIG. 4, except the light-shield pattern BW.

The light-shield pattern BW may be disposed on the bottom surface BB of the base member BL. In some embodiments, the light-shield pattern BW may be disposed on the second hard coating layer HC2. The present invention, however, is not limited thereto. When the second hard coating layer HC2 is omitted, the light-shield pattern BW may be directly disposed on the bottom surface BB of the base member BL.

The light-shield pattern BW defines a boundary between the transmission area TA and the bezel area BZA of the cover window WD-2. The light-shield pattern BW may include, but not limited to, a material capable of absorbing light. The light-shield pattern BW may be provided in the form of a film and disposed on the second hard coating layer HC2, or a printing may be performed to form the light-shield pattern BW on the second hard coating layer HC2.

According to the present invention, as the light-shield pattern BW disposed on the bottom surface BB of the base member BL is included, users may be prevented from seeing components disposed on the peripheral area NAA of the display panel DP.

Figure 7:
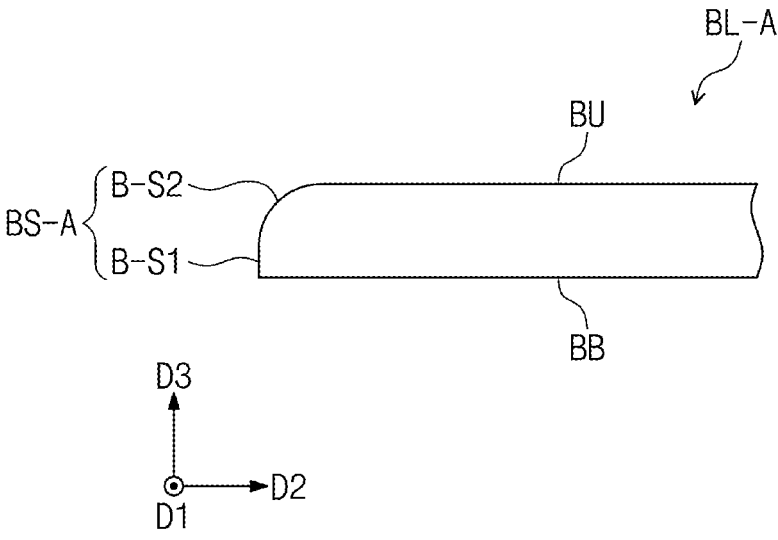
FIG. 7 illustrates a cross-sectional view showing a part of a cover window according to some embodiments of the present invention.
Figure 8:
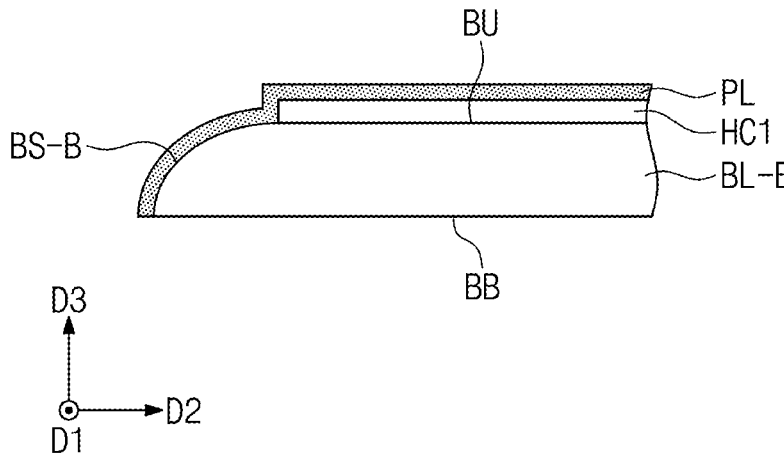
FIG. 8 illustrates a cross-sectional view showing a part of a cover window according to some embodiments of the present invention.

FIG. 7 illustrates a cross-sectional view showing a part of a cover window according to some embodiments of the present invention. FIG. 8 illustrates a cross-sectional view showing a part of a cover window according to some embodiments of the present invention. In the embodiments that follow, components identical or similar to those discusses above with reference to FIGS. 1 to 4 are allocated the same reference symbols, and a repetitive description will be omitted.

Referring to FIG. 7, a base member BL-A according to some embodiments has a top surface BU, a bottom surface BB, and a side surface BS-A. The top surface BU and the bottom surface BB may be opposite to each other. The side surface BS-A connects the top surface BU and the bottom surface BB to each other. The side surface BS-A includes a first part B-S1 and a second part B-S2.

In some embodiments, the first part B-S1 may be perpendicular to the bottom surface BB. That is, the first part B-S1 may extend in the thickness direction of the base member BL-A (i.e., the third direction DR3). The second part B-S2 may extend from the first part B-S1 and may have a curved surface.

The description of the protection layers PL and PL-1 of FIGS. 4 and 5 may also be applicable to the base member BL-A of the present embodiment. Therefore, a protection layer according to this embodiment may be disposed on an entire surface of the base member BL-A to cover a first hard coating layer (see HC1 of FIG. 4) disposed on the top surface BU of the base member BL-A, and may contact at least a portion of the side surface BS-A. For example, the protection layer may contact the second part B-S2 and may expose the first part B-S1. In addition, the protection layer according to this embodiment may contact only the second part B-S2 among the surfaces of the base member BL-A and the first hard coating layer HC1 may be partially exposed from the protection layer, but the present invention is not limited to this particular embodiment.

Referring to FIG. 8, a base member BL-B according to some embodiments has a top surface BU, a bottom surface BB, and a side surface BS-B. The top surface BU and the bottom surface BB may be opposite to each other. The side surface BS-B connects the top surface BU and the bottom surface BB to each other. The first hard coating layer HC1 may be disposed on the top surface BU. The first hard coating layer HC1 may expose the side surface BS-B.

In some embodiments, the side surface BS-B may include a curved surface. The present invention, however, is not limited thereto, and the side surface BS-B may include an irregular surface whose portion protrudes in another embodiment, and a shape of the base member BL-B is not restricted to a particular one.

The protection layer PL according to some embodiments may be disposed on an entire, upper surface BU of the base member BL-B to cover the first hard coating layer HC1 disposed on the top surface BU of the base member BL-B, and may be in contact with at least a portion of the side surface BS-B. The present invention, however, is not limited thereto, and likewise the protection layer PL-1 of FIG. 5, the protection layer PL may contact only the side surface BS-B of the surfaces of the base member BL and may expose the first hard coating layer HC1 in another embodiment.

FIGS. 9A to 9G illustrate cross-sectional views showing a method of manufacturing a cover window according to some embodiments of the present invention. In the embodiments that follow, components identical or similar to those discussed above with reference to FIGS. 1 to 6 are allocated the same reference symbols, and a repetitive description will be omitted. The following will describe a method of manufacturing a cover window according to some embodiments of the present invention in conjunction with FIGS. 9A to 9G.

Figure 9A:
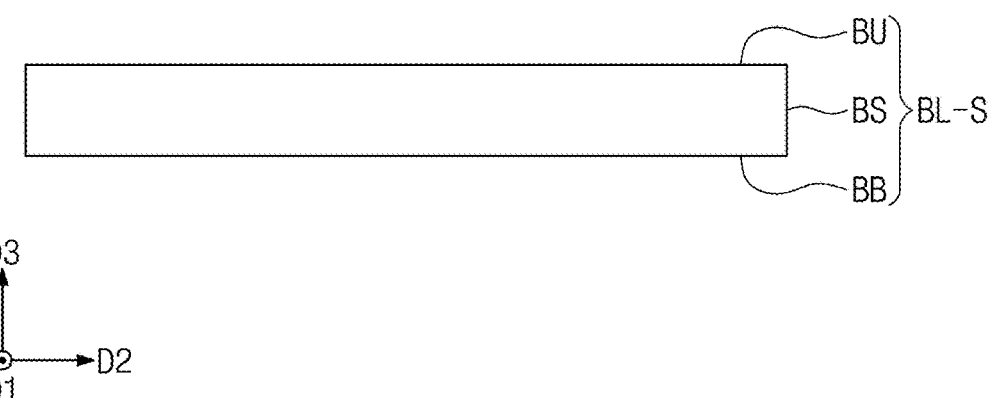
FIGS. 9A to 9G illustrate cross-sectional views showing a method of manufacturing a cover window according to some embodiments of the present invention.

Referring to FIG. 9A, a method of manufacturing a cover window may include providing a preliminary base member BL-S. The preliminary base member BL-S has a top surface BU, a bottom surface BB, and a side surface BS. The top surface BU and the bottom surface BB may be opposite to each other. The side surface BS connects the top surface BU and the bottom surface BB to each other.

Figure 9B:
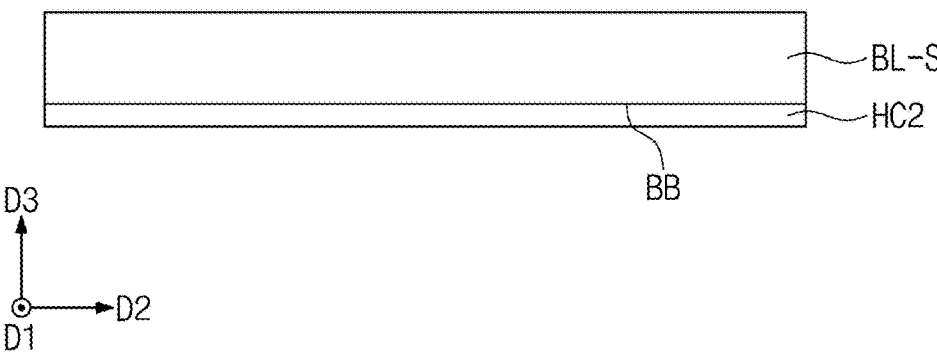

Referring to FIG. 9B, the method may include forming a lower hard coating layer HC2 (i.e., second hard coating layer) that covers the bottom surface BB. The lower hard coating layer HC2 may be formed by providing a coating composition on the bottom surface BB.

Figure 9C:
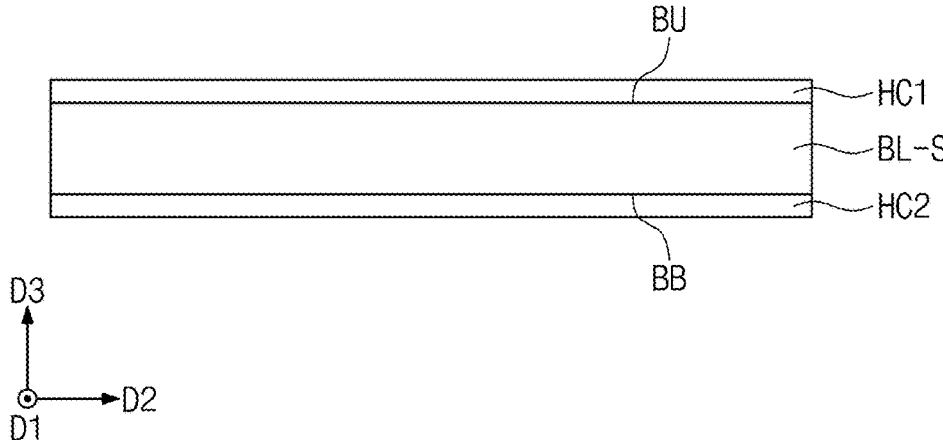

Referring to FIG. 9C, the method may include forming an upper hard coating layer HC1 (i.e., first hard coating layer) that covers the top surface BU. The upper hard coating layer HC1 may be formed by providing a coating composition on the top surface BU. The upper hard coating layer HC1 may be formed on the entirety of the surface BU of the preliminary base member BL-S.

Figure 9D:
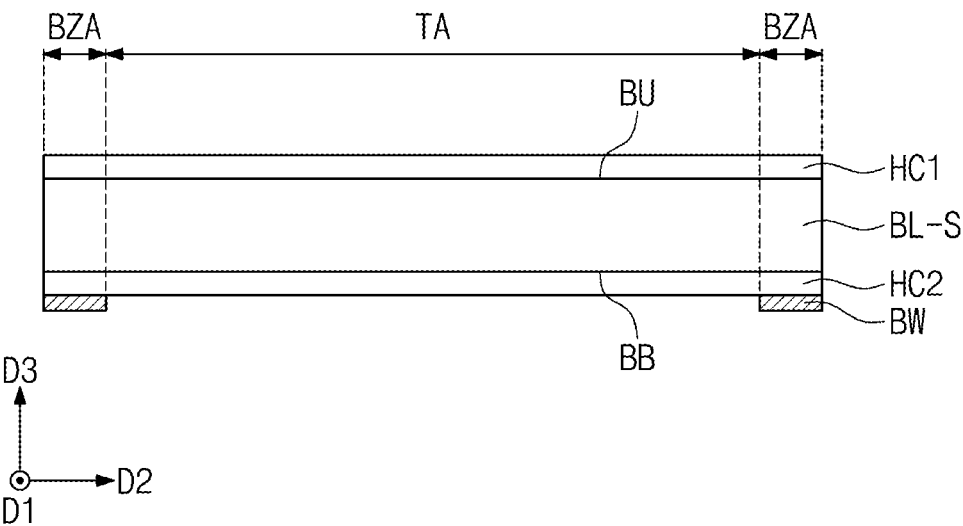

Referring to FIG. 9D, the method may include forming a light-shield pattern BW. The light-shield pattern BW may overlap an edge of the preliminary base member BL-S. The light-shield pattern BW may be disposed on the lower hard coating layer HC2. The light-shield pattern BW may define a boundary between the transmission area TA of the cover window (see WD of FIG. 1) and the bezel area BZA adjacent to the transmission area TA. The light-shield pattern BW may include a material capable of absorbing light. The light-shield pattern BW may overlap the bezel area BZA in the plan view. The light-shield pattern BW may be provided in the form of a film and may be attached to or printed on the lower hard coating layer HC2.

Figure 9E:
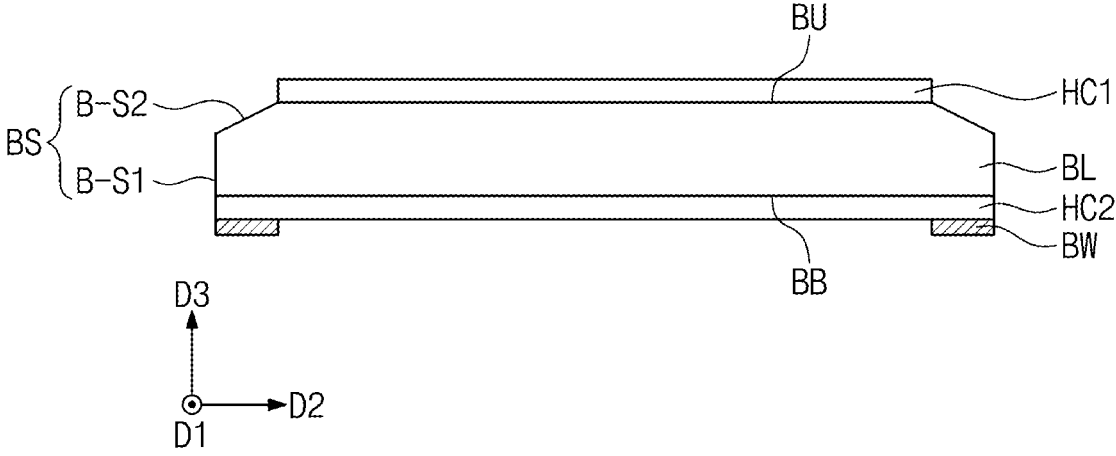

Referring to FIG. 9E, the method may include forming a base member BL by removing a portion of the preliminary base member BL-S. The base member BL may be formed when a part (e.g., edge parts) of the preliminary base member BL is removed, along the third direction D3, from the top surface BU of the preliminary base member BL-S. When the base member BL is formed, a first part B-S1 may be formed to extend from the bottom surface BB, and also a second part B-S2 may be formed to extend from the top surface BU and to incline from the first part B-S1 toward the top surface BU.

The cutting of the preliminary base member BL-S may remove a part of the upper hard coating layer HC1 disposed on a location where the preliminary base member BL-S is removed. Therefore, the second part B-S2 may be externally exposed.

Figure 9F:
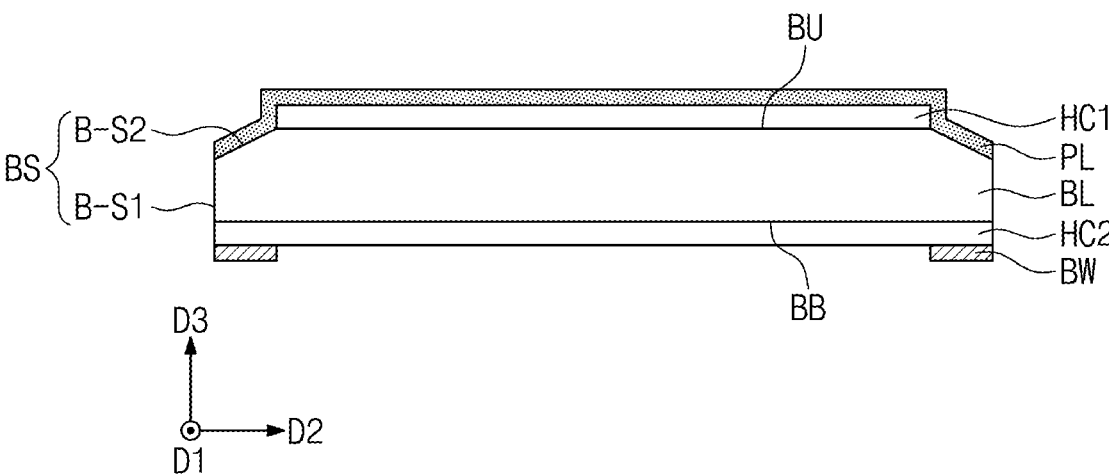

Referring to FIG. 9F, the method may include forming a protection layer PL. The protection layer PL covers the second part B-S2. In addition, the protection layer PL may cover the upper hard coating layer HC1. The protection layer PL may be formed by coating an organic or inorganic material on the base member BL.

According to the present invention, before the base member BL is formed, the upper hard coating layer HC1 may be formed to cover an entire, upper surface BU of the preliminary base member BL-S, and after the base member BL is formed, the protection layer PL may be formed to cover the externally exposed second part B-S2 of the base member BL, with the result that the upper hard coating layer HC1 may be uniformly provided and a side surface, externally exposed by the cutting process, of the base member BL may be effectively protected.

Figure 9G:
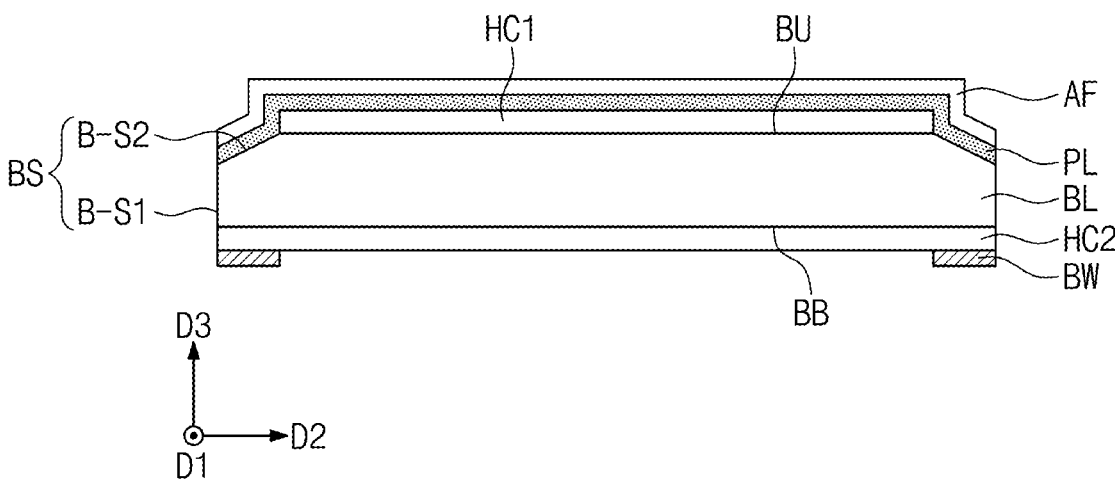

Referring to FIG. 9G, the method may further include forming an anti-fingerprint layer AF. The anti-fingerprint layer AF may be coated on the protection layer PL. The present invention, however, is not limited thereto, and an anti-reflection layer (not shown) may further be formed on the protection layer PL.

FIGS. 10A to 10D illustrate cross-sectional views showing a method of manufacturing a cover window according to some embodiments of the present invention. In the embodiment that follows, components identical or similar to those discusses above with reference to FIGS. 9A to 9G are allocated the same reference symbols, and a repetitive description will be omitted.

Figure 10A:
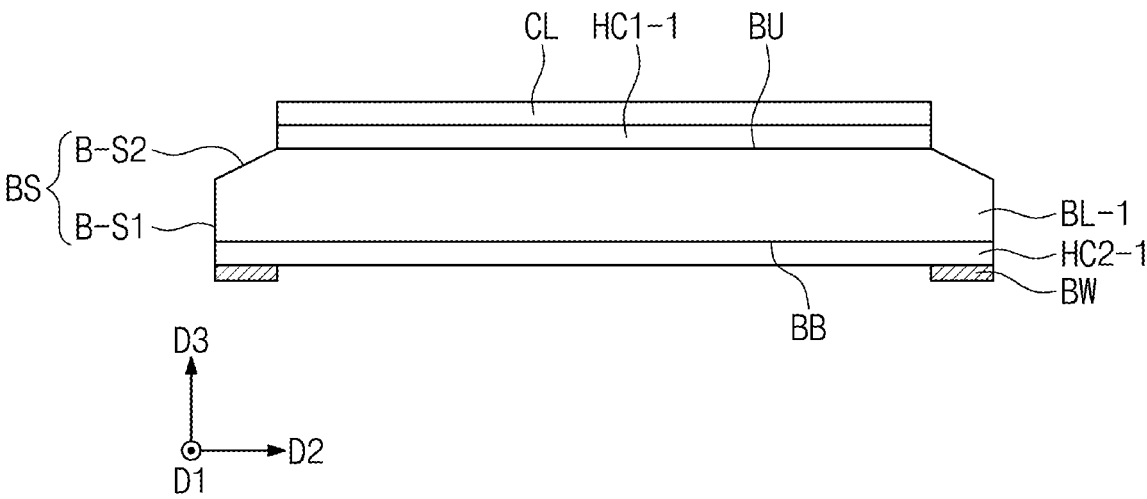
FIGS. 10A to 10D illustrate cross-sectional views showing a method of manufacturing a cover window according to some embodiments of the present invention.

FIG. 10A shows an embodiment after the step discussed in FIG. 9E in which a part of the preliminary base member BL-S is removed to form the base member BL.

Referring to FIG. 10A, a method of manufacturing a cover window may include attaching a release film CL. The release film CL may have a shape that corresponds to the shape of an upper hard coating layer HC1-1 and may be attached to the upper hard coating layer HC1-1. An adhesive force between the release film CL and the upper hard coating layer HC1-1 may be less than an adhesive force between the upper hard coating layer HC1-1 and a base member BL-1.

Figure 10B:
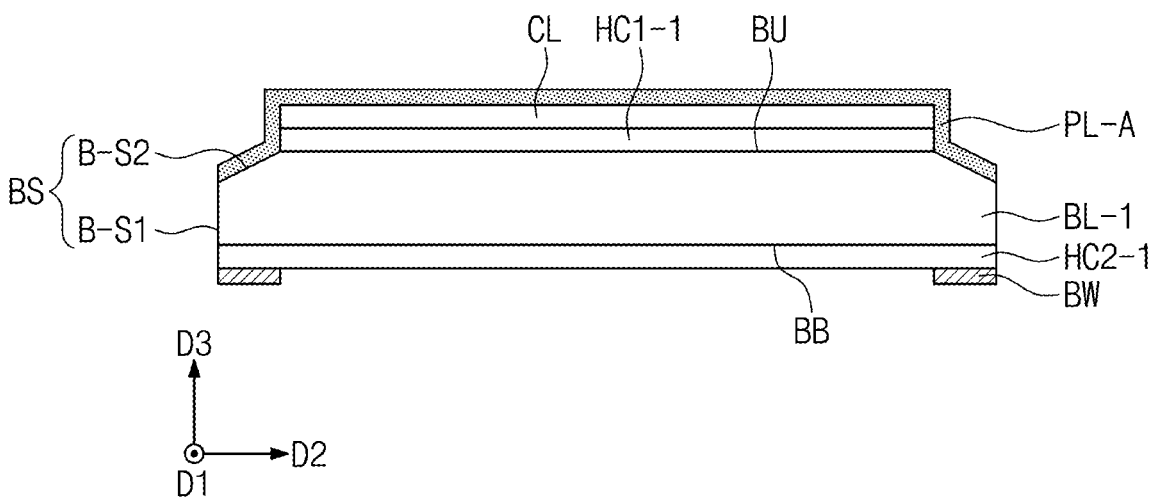

Referring to FIG. 10B, the method may include forming a protection layer PL-A. The protection layer PL-A may cover the release film CL and the second part B-S2.

Figure 10C:
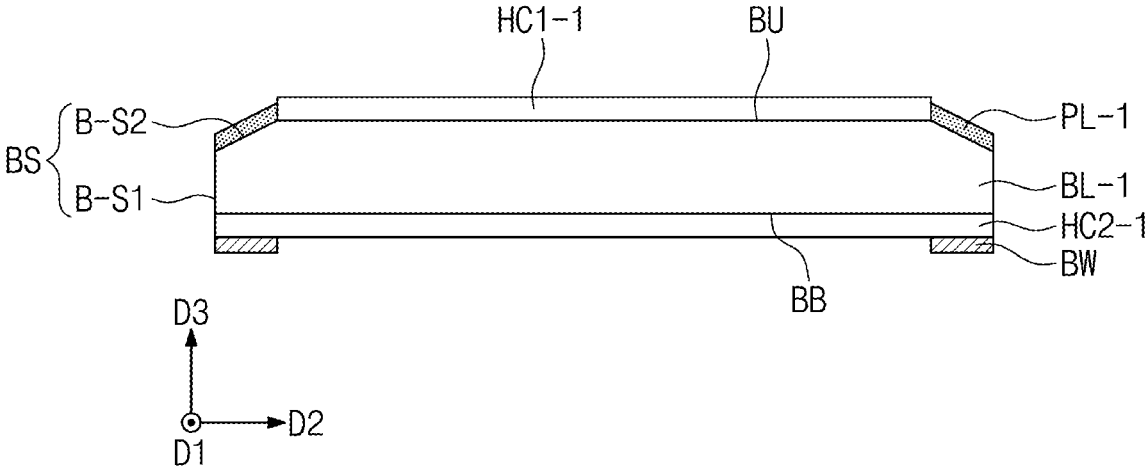

Referring to FIG. 10C, the method may include removing the release film CL. When the release film CL is removed, the part of the protection layer PL-A on the release film CL may be removed simultaneously with the release film CL.

Therefore, in some embodiments, the protection layer PL-1 may remain only on the second part B-S2. Accordingly, the protection layer PL-1 may partially surround and partially expose the upper hard coating layer HC1-1. Here, the protection layer PL-1 is the remaining part of the protection layer PL-A.

Figure 10D:
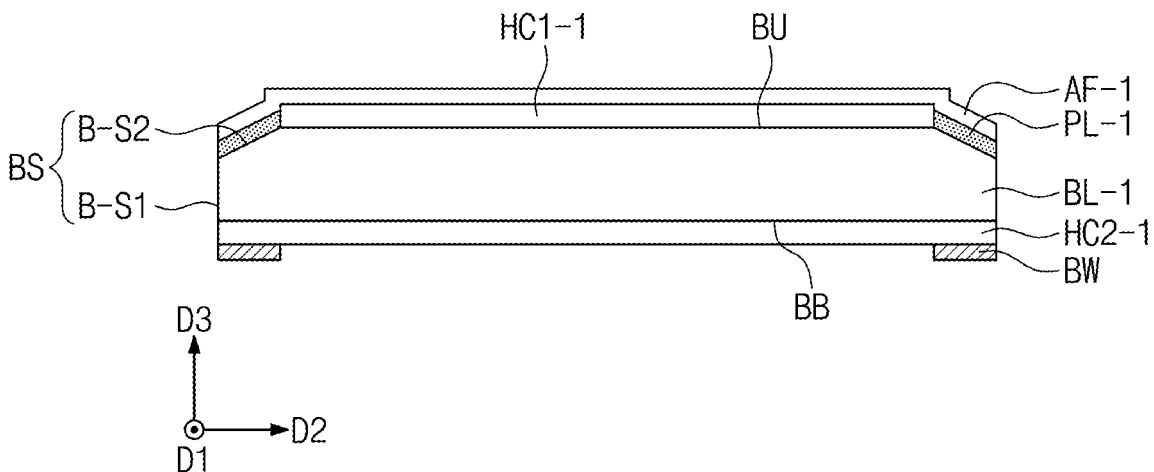

Referring to FIG. 10D, the method may further include forming an anti-fingerprint layer AF-1. In some embodiments, the anti-fingerprint layer AF-1 may cover the protection layer PL-1 and the upper hard coating layer HC1-1.

According to the present invention, when a cover window is partially removed to form an inclined side surface, a protection layer may be included to protect a portion of the cover window, on which portion a hard coating layer is not formed, and thus the cover window may increase in durability and surface quality. In conclusion, it may be possible to provide a cover window with improved reliability.

Although the embodiments have been described with reference to a number of illustrative examples thereof, it will be understood by those of ordinary skill in the art that various changes in form and details may be made without departing from the spirit and scope of the present invention as set forth in the following claims.

Thus, the technical scope of the present invention is not limited by the embodiments and examples described above, but by the following claims.

What is claimed is:

1. A cover window, comprising:
   a base member which includes a top surface, a bottom surface opposite to the top surface, and a side surface connecting the top surface and the bottom surface, wherein the side surface includes a first part which extends from the bottom surface and a second part which extends from the top surface, and the second part is inclined in a direction from the top surface to the bottom surface;
   a first hard coating layer disposed on the top surface of the base member and exposing the side surface of the base member;
   a second hard coating layer disposed under an entirety of the bottom surface,
   a protection layer directly disposed on at least the second part extending from the top surface and inclined in the direction from the top surface to the bottom surface; and
   a light-shield pattern disposed under the second hard coating layer,
   wherein the light-shield pattern is in contact with a portion of the second hard coating layer overlapping the inclined second part of the base member in a plan view and spaced from the first hard coating layer, and at least a portion of the protection layer is in contact with the second part.

2. The cover window of claim 1, wherein the protection layer covers the first hard coating layer.

3. The cover window of claim 1, wherein the protection layer exposes the first hard coating layer.

4. The cover window of claim 1, further comprising an anti-fingerprint layer which covers the protection layer and overlaps the top surface in the plan view.

5. The cover window of claim 1, further comprising:

a transmission area; and a bezel area of which optical transmittance is less than an optical transmittance of the transmission area, wherein the light-shield pattern defines a boundary between the transmission area and the bezel area.

6. The cover window of claim 1, wherein the first part is perpendicular to the bottom surface at a point in which the first part directly contacts the bottom surface, and wherein the second part is a curved surface.

7. The cover window of claim 1, wherein the side surface is curved.

8. The cover window of claim 1, wherein the protection layer includes polysilazane.

9. The cover window of claim 1, wherein the protection layer includes at least one selected from silicon nitride (SiNx), silicon oxide (SiOx), and silicon oxynitride (SiOxNy).

* * * * *